(12) United States Patent
Booth, Jr. et al.

(10) Patent No.: US 8,513,723 B2
(45) Date of Patent: Aug. 20, 2013

(54) METHOD AND STRUCTURE FOR FORMING HIGH PERFORMANCE MOS CAPACITOR ALONG WITH FULLY DEPLETED SEMICONDUCTOR ON INSULATOR DEVICES ON THE SAME CHIP

(75) Inventors: Roger A. Booth, Jr., Hopewell Junction, NY (US); Kangguo Cheng, Albany, NY (US); Bruce B. Doris, Hopewell Junction, NY (US); Ghavam G. Shahidi, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 699 days.

(21) Appl. No.: 12/689,743

(22) Filed: Jan. 19, 2010

(65) Prior Publication Data

US 2011/0175152 A1     Jul. 21, 2011

(51) Int. Cl.
*H01L 27/12*          (2006.01)
(52) U.S. Cl.
USPC ..... 257/306; 257/350; 257/379; 257/E27.112
(58) Field of Classification Search
USPC .................. 257/303, 306, E21.011, E21.704, 257/E27.112
See application file for complete search history.

(56) References Cited

U.S. PATENT DOCUMENTS

| | | |
|---|---|---|
| 4,791,610 A | 12/1988 | Takemae |
| 5,759,907 A | 6/1998 | Assaderaghi et al. |
| 5,770,875 A | 6/1998 | Assaderaghi et al. |
| 5,959,322 A | 9/1999 | Lee |
| 5,976,945 A | 11/1999 | Chi et al. |
| 6,171,923 B1 | 1/2001 | Chi et al. |
| 6,358,791 B1 | 3/2002 | Hsu et al. |
| 6,380,578 B1 | 4/2002 | Kunikiyo |
| 6,387,772 B1 | 5/2002 | Chittipeddi et al. |
| 6,429,069 B1 | 8/2002 | Dennison et al. |
| 6,465,830 B2 | 10/2002 | Babcock et al. |
| 6,518,814 B1 | 2/2003 | Majid et al. |
| 6,552,381 B2 | 4/2003 | Chittipeddi et al. |
| 6,614,068 B1 | 9/2003 | Chung |
| 6,620,672 B1 | 9/2003 | Dennison et al. |
| 6,635,525 B1 | 10/2003 | Mandelman et al. |
| 6,635,915 B2 | 10/2003 | Kokubun |
| 6,649,959 B2 | 11/2003 | Hsu et al. |
| 6,703,273 B2 | 3/2004 | Wang et al. |
| 6,798,021 B2 | 9/2004 | Ipposhi et al. |
| 6,815,749 B1 | 11/2004 | Mandelman et al. |
| 6,825,545 B2 | 11/2004 | Nasr |

(Continued)

*Primary Examiner* — Minh-Loan T Tran
*Assistant Examiner* — Fazli Erdem
(74) *Attorney, Agent, or Firm* — Scully, Scott, Murphy & Presser, P.C.; Daniel P. Morris, Esq.

(57) ABSTRACT

An integrated circuit is provided that includes a fully depleted semiconductor device and a capacitor present on a semiconductor on insulator (SOI) substrate. The fully depleted semiconductor device may be a finFET semiconductor device or a planar semiconductor device. In one embodiment, the integrated circuit includes a substrate having a first device region and a second device region. The first device region of the substrate includes a first semiconductor layer that is present on a buried insulating layer. The buried insulating layer that is in the first device region is present on a second semiconductor layer of the substrate. The second device region includes the second semiconductor layer, but the first semiconductor layer and the buried insulating layer are not present in the second device region. The first device region includes the fully depleted semiconductor device. A capacitor is present in the second device region.

10 Claims, 9 Drawing Sheets

(56) References Cited

U.S. PATENT DOCUMENTS

| | | |
|---|---|---|
| 6,858,491 B1 | 2/2005 | Kokubun |
| 6,964,897 B2 | 11/2005 | Bard et al. |
| 7,102,204 B2 | 9/2006 | Berndlmaier et al. |
| 7,232,745 B2 | 6/2007 | Mandelman et al. |
| 7,315,075 B2 | 1/2008 | Aitken et al. |
| 2003/0193058 A1* | 10/2003 | Fried et al. .................. 257/200 |
| 2006/0084212 A1* | 4/2006 | Anderson et al. ............ 438/197 |
| 2006/0105536 A1* | 5/2006 | Cheng et al. ................ 438/386 |
| 2006/0252226 A1 | 11/2006 | Berndlmaier et al. |
| 2007/0202637 A1 | 8/2007 | Mandelman et al. |
| 2007/0272961 A1 | 11/2007 | Aitken et al. |
| 2008/0064178 A1 | 3/2008 | Ho et al. |

\* cited by examiner

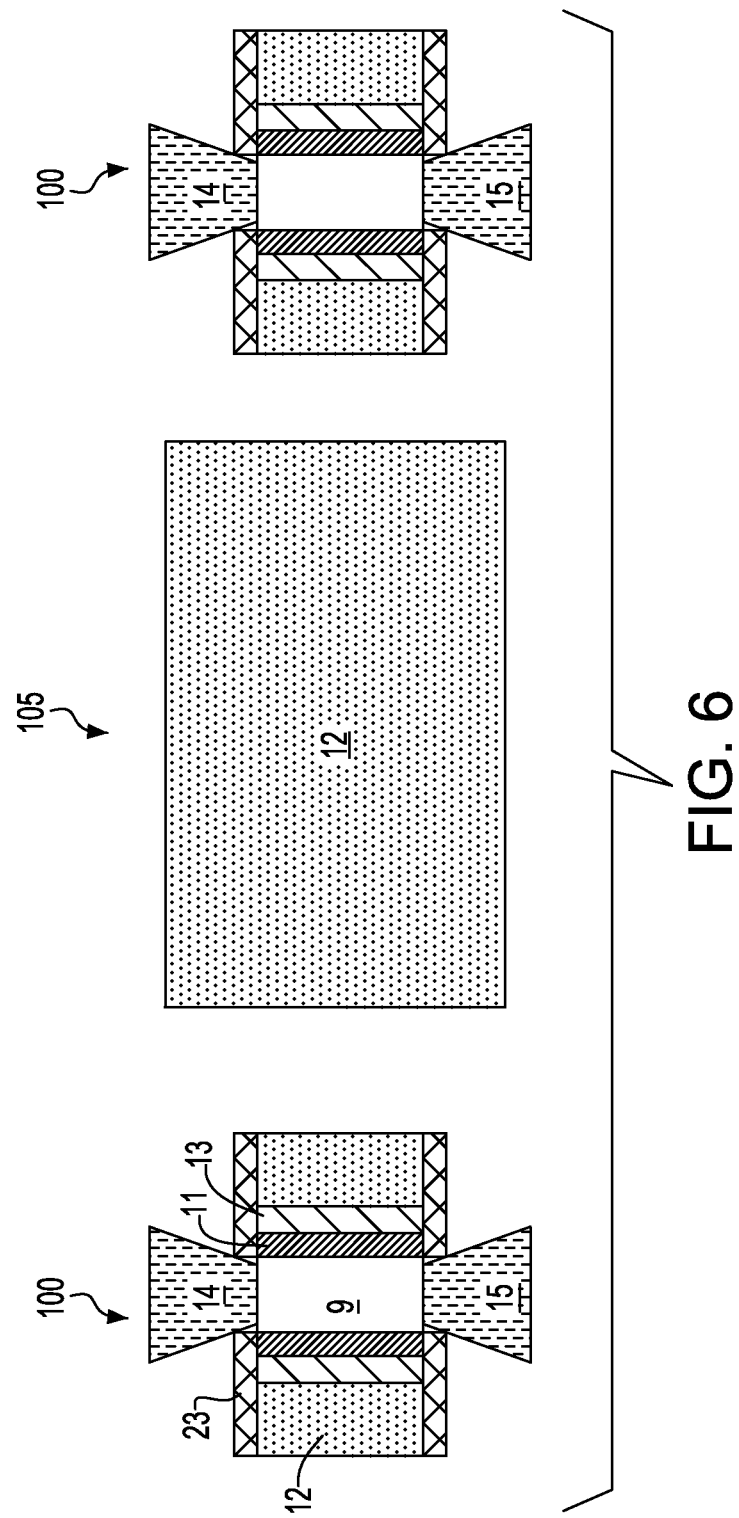

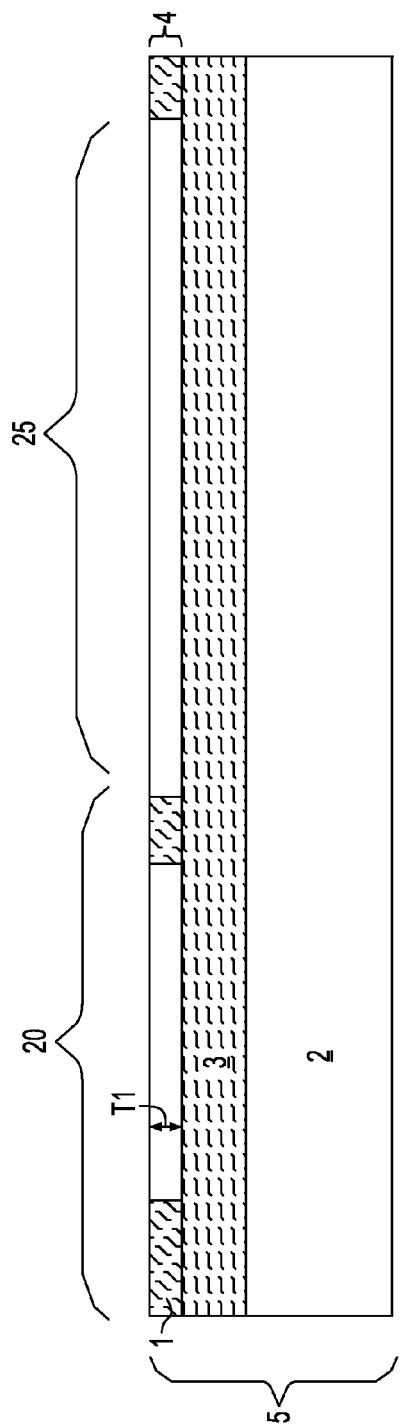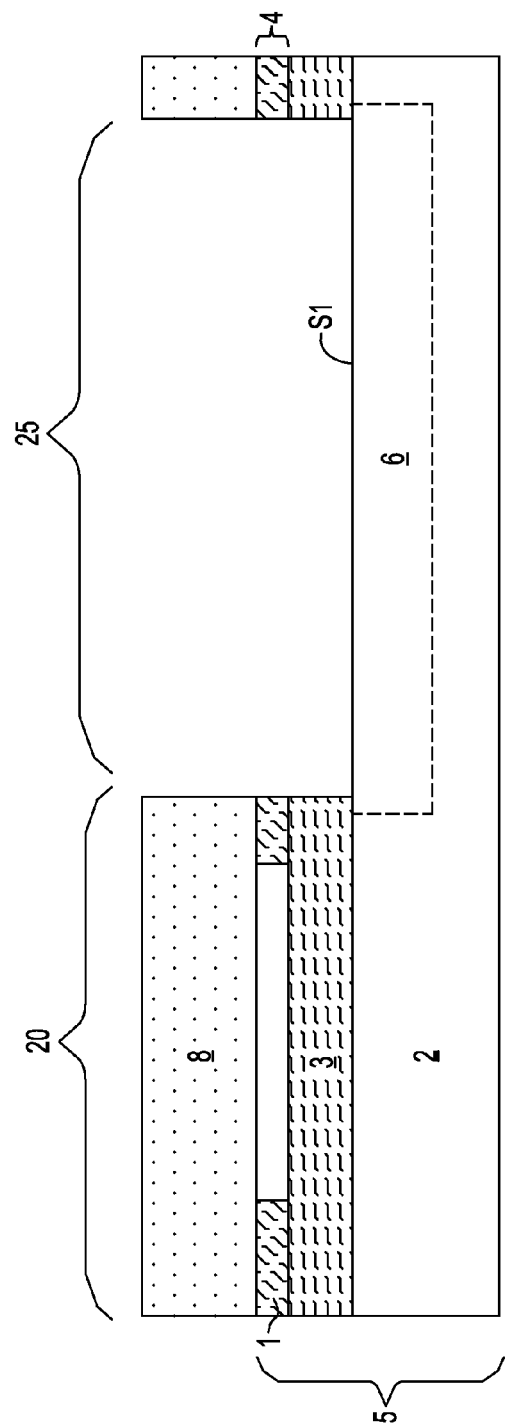

METHOD AND STRUCTURE FOR FORMING HIGH PERFORMANCE MOS CAPACITOR ALONG WITH FULLY DEPLETED SEMICONDUCTOR ON INSULATOR DEVICES ON THE SAME CHIP

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of capacitors, such as metal oxide semiconductor capacitors, and field effect transistors (FETs), such as metal-oxide-semiconductor field effect transistors (MOSFETs). Scaling achieves compactness and improves operating performance in devices by shrinking the overall dimensions and operating voltages of the device while maintaining the device's electrical properties. The dimensions of the device should be scaled simultaneously in order to optimize the electrical performance of the device.

SUMMARY

An integrated circuit is provided that includes a finFET device and a capacitor present on a semiconductor on insulator (SOI) substrate. In one embodiment, the integrated circuit includes a substrate having a first device region and a second device region. The first device region of the substrate includes a first semiconductor layer that is present on a buried insulating layer. The buried insulating layer that is in the first device region is present on a second semiconductor layer of the substrate. The second device region includes the second semiconductor layer, but the first semiconductor layer and the buried insulating layer are not present in the second device region. A finFET semiconductor device is present in the first device region of the substrate, in which the first semiconductor layer provides the fin body of the finFET semiconductor device. A capacitor is present in the second device region, in which the capacitor includes a buried plate electrode, a node dielectric and an upper electrode. The buried plate electrode is present in the second semiconductor layer of the substrate, the node dielectric is present on an upper surface of the second semiconductor layer, and the upper electrode is present on the node dielectric.

In another aspect, a method of forming an integrated circuit including a finFET and a capacitor on an SOI substrate is provided. A first device region of the SOI substrate includes the finFET semiconductor device, and a second device region of the SOI substrate includes the capacitor. In one embodiment, the method includes providing an SOI substrate having a first semiconductor layer that is present on a buried insulating layer. The buried insulating layer is present on a second semiconductor layer. The first semiconductor layer and the buried insulating layer are removed from a second device region of the SOI substrate to expose a surface of the second semiconductor layer, wherein a remaining portion of the first semiconductor layer and the buried insulating layer are present in the first device region. A finFET semiconductor device is formed in the first device region, in which the first semiconductor layer provides the fin body of the finFET semiconductor device. A capacitor is formed in the second device region, in which the surface of the second semiconductor layer that is exposed is implanted to provide a buried plate electrode. The capacitor further includes a node dielectric that is deposited atop the surface of the second semiconductor layer containing the buried plate electrode, and an upper electrode that is formed on the node dielectric.

In another embodiment, an integrated circuit is provided that includes a planar semiconductor device and a capacitor present on a semiconductor on insulator (SOI) substrate, in which the first semiconductor layer, i.e., SOI layer, of the SOI substrate has a thickness that is no greater than 10 nm. The integrated circuit includes a substrate having a first device region and a second device region. The first device region of the substrate includes a first semiconductor layer having a thickness of 10 nm or less, which is present on a buried insulating layer. The buried insulating layer is present in the first device region and is located on a second semiconductor layer of the substrate. The second device region includes the second semiconductor layer, but the first semiconductor layer and the buried insulating layer is not present in the second device region. The planar semiconductor device is present in the first device region of the substrate, wherein at least the channel region of the planar semiconductor device is provided by the first semiconductor layer. The capacitor is present in the second device region of the substrate, in which the surface of the second semiconductor layer that is exposed is implanted to provide a buried plate electrode. The capacitor further includes a node dielectric that is deposited atop the surface of the second semiconductor layer containing the buried plate electrode, and an upper electrode that is formed on the node dielectric.

In another aspect, a method of forming an integrated circuit including a planar semiconductor device and a capacitor on a semiconductor-on-insulator (SOI) substrate is provided. A first device region of the substrate includes the planar semiconductor device, and a second device region of the substrate includes the capacitor. In one embodiment, the method includes providing a substrate having a first semiconductor layer with a thickness of 10 nm or less. The first semiconductor layer is present on a buried insulating layer. The buried insulating layer is present on a second semiconductor layer. The first semiconductor layer and the buried insulating layer are removed from the second device region of the substrate to expose a surface of the second semiconductor layer, wherein a remaining portion of the first semiconductor layer and the buried insulating layer is present in the first device region. A planar semiconductor device is formed in the first device region, in which the first semiconductor layer provides at least the channel of the planar semiconductor device. A capacitor is formed in the second device region, in which the surface of the second semiconductor layer that is exposed is implanted to provide a buried plate electrode. The capacitor further includes a node dielectric that is deposited atop the surface of the second semiconductor layer containing the buried plate electrode, and an upper electrode that is formed on the node dielectric.

DESCRIPTION OF THE DRAWINGS

The following detailed description, given by way of example and is not intended to limit the invention solely thereto, will best be appreciated in conjunction with the accompanying drawings, wherein like reference numerals denote like elements and parts, in which:

FIG. 6 is a top down view depicting the cross-section of the structure that is illustrated in FIG. 5 along section line A-A.

FIG. 7 is a side cross-sectional view depicting forming isolation regions in the semiconductor substrate that is depicted in FIG. 1 to define a first device region and a second device region, in accordance with one embodiment of a method for forming an integrated circuit having a planar semiconductor device and an on-chip capacitor.

FIG. 8 is a side cross-sectional view depicting removing the first semiconductor layer and the buried insulating layer from the second device region of the substrate to expose a surface of the second semiconductor layer, and forming a buried plate electrode in the second semiconductor layer, in accordance with a second embodiment of the present method.

DETAILED DESCRIPTION

Figure 1:
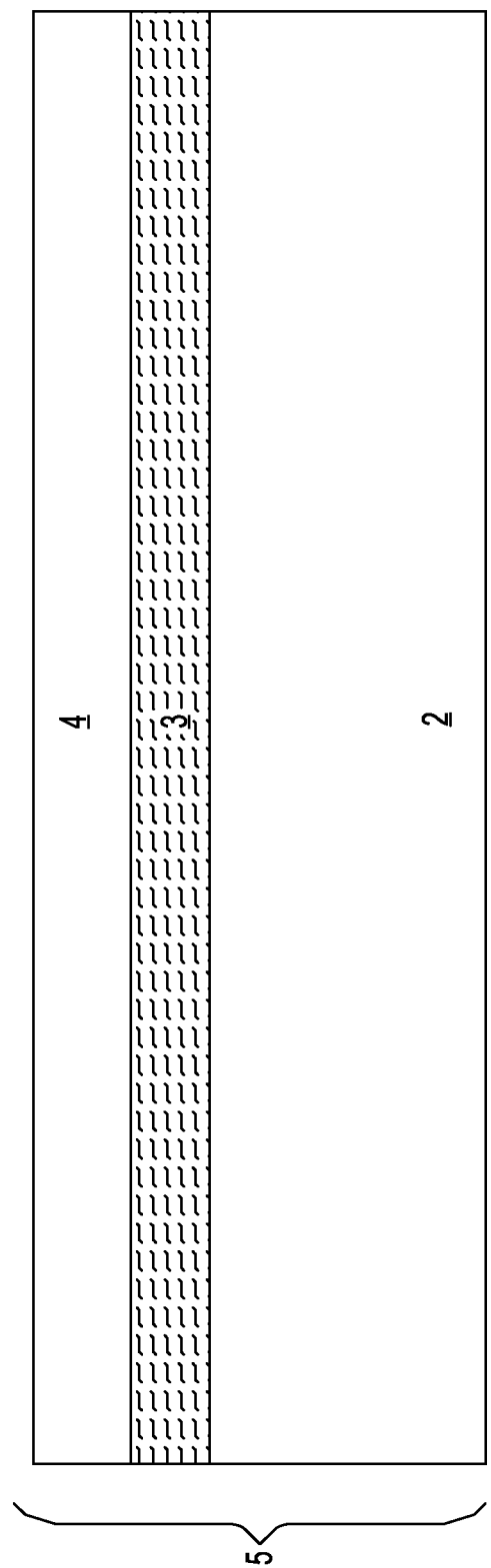
FIG. 1 is a side cross-sectional view depicting providing a substrate including a first semiconductor layer atop a dielectric layer, in accordance with one embodiment of a method for forming an integrated circuit having a fin FET semiconductor device and an on-chip capacitor.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present disclosure relates to a method for forming a capacitor and a fully depleted semiconductor device on the same semiconductor on insulator (SOI) substrate. The semiconductor on insulator (SOI) substrate may be an extremely thin semiconductor on insulator (ET-SOI). An extremely thin semiconductor on insulator (ETSOI) substrate includes an extremely thin semiconductor on insulator (ETSOI) layer overlying a buried insulating layer, in which the extremely thin semiconductor on insulator (ET-SOI) layer has a thickness of 10 nm or less.

Fully depleted semiconductor devices suppress short channel effects. Short channel effects are the decrease in threshold voltage due to two-dimensional electrostatic charge sharing between the gate and the source and drain regions of semiconductor devices. FinFET devices are one form of semiconductor device that may be fully depleted. In one embodiment, and in order to provide a fully depleted finFET, the fin body of the finFET can be composed of a semiconductor material having a width of less than 10 nm. Planar semiconductor devices may be fully depleted by forming the channel of the device with an extremely thin semiconductor on insulator (ETSOI) layer, i.e., a semiconductor layer having a thickness of less than 10 nm. On-chip capacitors, e.g., metal oxide semiconductor capacitors (MOSCAP), are suitable for a variety of integrated circuit (IC) applications, such as to suppress the noise of power supplies. On-chip capacitors formed on extremely thin semiconductor on insulator (ETSOI) layers typically have a reduced capacitance due to the high resistance of the thickness of the ETSOI layer and the low doping concentration in the ETSOI layer.

In accordance with some embodiments of the disclosure, a fully depleted semiconductor device is formed in one device region of an SOI substrate, and a capacitor, e.g., metal oxide semiconductor capacitor (MOSCAP), is formed in a second device region of the SOI substrate, in which the SOI layer and the buried insulating layer are not present. Therefore, in some embodiments, the upper semiconductor layer (SOI layer) of an SOI substrate may be utilized to provide a fully depleted semiconductor device, while a capacitor may be positioned on a portion of the SOI substrate that does not include the high resistance SOI layer and the buried insulating layer. When describing the following structures and methods, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. The dominant carrier concentration in an extrinsic semiconductor determines the conductivity type of the semiconductor.

As used herein a "field effect transistor" is a transistor in which output current, i.e., source-drain current, is controlled by the voltage applied to the gate. A field effect transistor has three terminals, i.e., gate, source and drain.

As used herein, the term "conductivity type" denotes a dopant region being p-type or n-type.

As used herein, a "fin body" refers to a semiconductor material, which is employed as the body of a semiconductor device, in which the gate structure is positioned around the fin structure such that charge carriers flow down the channel on the two sidewalls of the fin structure and optionally along the top surface of the fin structure.

As used herein, the term "channel" is the region underlying the gate structure and between the source and drain of a semiconductor device that becomes conductive when the semiconductor device is turned on.

A "capacitor" is a structure including two electrically conductive materials separated and insulated from each other by a dielectric for storing a charge.

The term "electrode" as used to describe a component of the capacitor represents one of at least two electrically conductive materials of the capacitor that are separated by the node dielectric layer.

A "node dielectric layer" is the dielectric layer that is present between the electrodes of the capacitor.

The term "direct contact" or "directly on" means that a first element, such as a first structure, and a second element, such as a second structure, are physically in contact without any intermediary conducting, insulating or semiconductor layers at the interface of the two elements.

The terms "overlying", "atop", "positioned on" or "positioned atop" mean that a first element, such as a first structure, is present on a second element, such as a second structure, wherein intervening elements, such as an interface structure may be present between the first element and the second element.

FIGS. 1-5 depict one embodiment of a method of forming an integrated circuit including a finFET semiconductor device 100 and a capacitor 105, e.g., semiconductor-containing capacitor, such as a metal oxide semiconductor capacitor (MOSCAP) on a semiconductor on insulator (SOI) substrate.

FIG. 1 illustrates the results of the initial processing steps that produce a substrate 5, i.e., semiconductor on insulator (SOI) substrate, in which the substrate 5 comprises at least a first semiconductor layer 4 overlying a buried insulating layer 3. A second semiconductor layer 2 may be present underlying the buried insulating layer 3.

The first semiconductor layer 4 may comprise any semiconducting material including, but not limited to Si, strained Si, SiC, SiGe, SiGeC, Si alloys, Ge, Ge alloys, GaAs, InAs, and InP, or any combination thereof. In one embodiment, the first semiconductor layer 4 has a thickness ranging from 10.0 nm to 40.0 nm. In another embodiment, the first semiconductor layer 4 has a thickness ranging from 10.0 nm to 30.0 nm. In yet another embodiment, the first semiconductor layer 4 may be an extremely thin semiconductor on insulator (ET-SOI) layer having a thickness of less than 10.0 nm. The second semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The buried insulating layer 3 may be an oxide, such as silicon oxide, a nitride, such as silicon nitride, or an oxynitride, such as silicon oxynitride. In one embodiment, the buried insulating layer 3 has a thickness ranging from 5.0 nm to 40.0 nm. In another embodiment, the buried insulating layer 3 has a thickness ranging from 10.0 nm to 30.0 nm. The buried insulating layer 3 may be formed by implanting a high-energy dopant into the substrate 5 and then annealing the structure to form the buried insulating layer 3. In another embodiment, the buried insulating layer 3 may be deposited or grown prior to the formation of the first semiconductor layer 4. In yet another embodiment, the substrate 5 may be formed using wafer-bonding techniques, where a bonded wafer pair is formed utilizing glue, adhesive polymer, or direct bonding.

Figure 2:
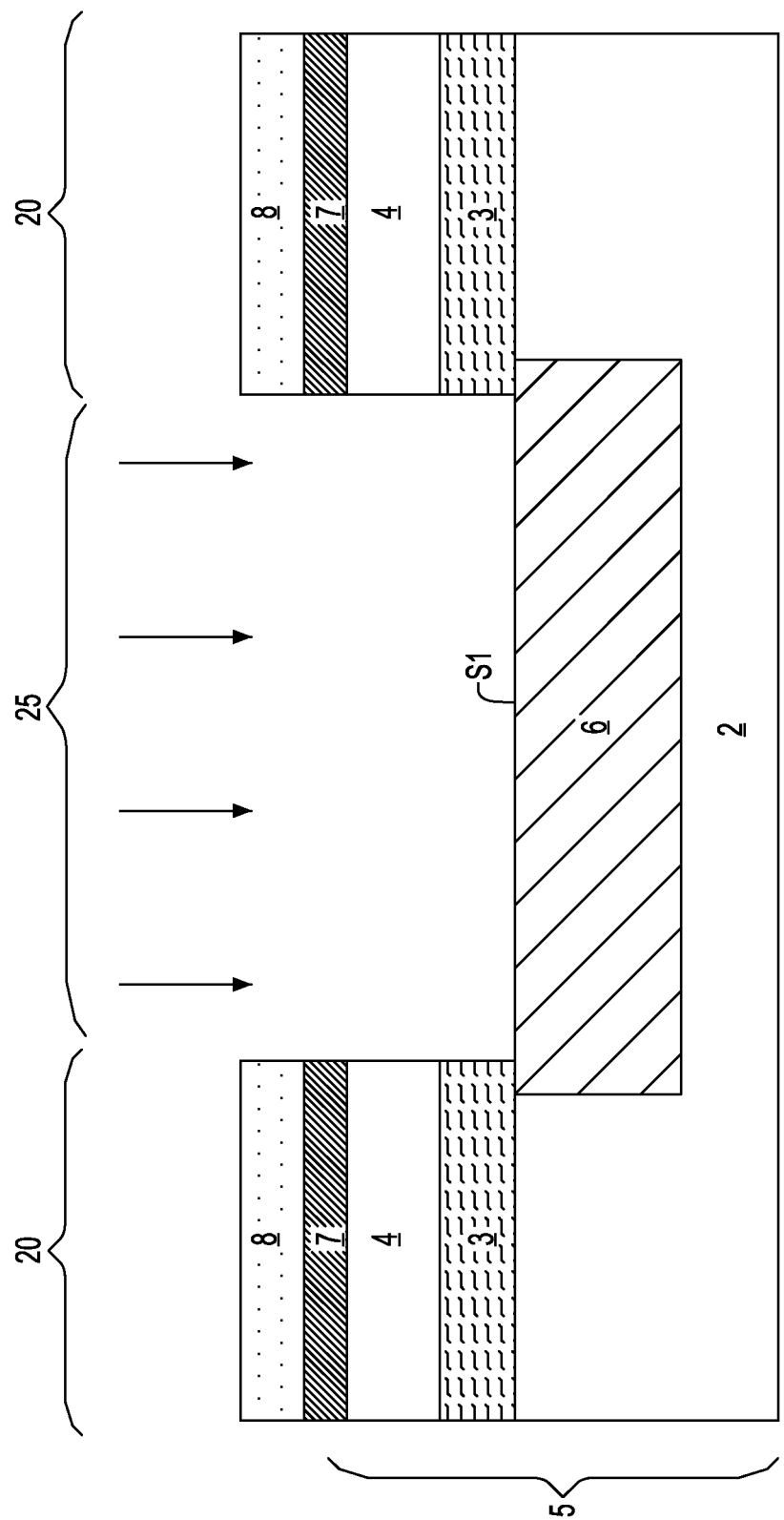
FIG. 2 is a side cross-sectional view depicting removing the first semiconductor layer and the buried insulating layer from a second device region of the substrate to expose a surface of the second semiconductor layer, and forming a buried plate electrode in the second semiconductor layer, in accordance with a first embodiment of the present method.

FIG. 2 depicts one embodiment of removing the first semiconductor layer 4 and the buried insulating layer 3 from a second device region 25 of the substrate 5 to expose a surface S1 of the second semiconductor layer 2, and forming a buried plate electrode 6 in the second semiconductor layer 2.

In one embodiment, at least one pad dielectric layer 7 is formed on the first semiconductor layer 4. The at least one pad dielectric layer 7 may be formed on the surface of the substrate 5 using deposition and/or thermal growth processes. In one embodiment, the at least one pad dielectric layer 7 serves as an etch mask during removal of the first semiconductor layer 4 and the buried insulating layer 3 from the second device region 25 of the substrate 5. The at least one pad dielectric layer 7 may be composed of a single pad dielectric layer, or the at least one pad dielectric layer 7 may comprise a multi-layered structure. For example, the least one pad dielectric layer 7 may comprise an oxide, a nitride, or a doped silicate glass material, or two or more of the aforementioned materials may be employed.

In the example depicted in FIG. 2, the at least one pad dielectric layer 7 includes a single pad dielectric layer. In one embodiment, the single pad dielectric layer is selected from the group consisting of a pad oxide layer and a pad nitride layer. When the single pad dielectric layer is composed of a pad oxide layer, the pad oxide layer may be silicon oxide having a thickness ranging from 1 nm to 10 nm, typically being 5 nm. In one embodiment, the single pad dielectric layer is a thermally grown oxide. When the single pad dielectric layer is composed of a pad nitride layer, the pad nitride layer may be silicon nitride having a thickness ranging from 10 nm to 100 nm.

In one embodiment, a first photoresist mask 8 is formed overlying the first semiconductor layer 4 in which the portion of the substrate 5 that is underlying the first photoresist mask 8 corresponds to the first device region 20, and the portion of the substrate 5 that is not protected by the first photoresist mask 8 corresponds to the second device region 25. To provide the first photoresist mask 8, a photoresist layer is first positioned atop the at least one pad dielectric layer 7. The photoresist layer may be provided by a blanket layer of photoresist material that is formed utilizing a deposition process such as, for example, CVD, PECVD, evaporation or spin-on coating. The blanket layer of photoresist material is then patterned to provide the first photoresist mask 8 utilizing a lithographic process that may include exposing the photoresist material to a pattern of radiation and developing the exposed photoresist material utilizing a resist developer.

Following the formation of the first photoresist mask 8, an etching process may remove the unprotected portions of the first semiconductor layer 4 and the buried insulating layer 3 selective to the second semiconductor layer 2 of the substrate 5. As used herein, the term "selective" in reference to a material removal process denotes that the rate of material removal for a first material is greater than the rate of removal for at least another material of the structure to which the material removal process is being applied. In one example, the transferring of the pattern provided by the photoresist into the substrate 5 may include an anisotropic etch. An anisotropic etch process is a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In one embodiment, following the formation of the first photoresist mask 8, a three stage anisotropic etch may be conducted, in which a first selective etch removes the exposed portions of the at least one pad dielectric layer 7. The first photoresist mask 8 protects the portion of the at least one pad dielectric layer 7 that is present beneath the first photoresist mask 8 from being etched. The first stage of the anisotropic etch may continue until the portion of the at least one pad dielectric layer 7 exposed by the photoresist mask 8 is removed to expose the first semiconductor layer 4. In a second stage of the two stage anisotropic etch, the exposed portions of the first semiconductor layer 4 are removed by an etch chemistry that removes the material of the first semiconductor layer 4 selective to the buried insulating layer 3 and the first photoresist mask 8. During the third stage of the anisotropic etching, the exposed portion of the buried insulating layer 3 is removed selective to the first photoresist mask 8 and the second semiconductor layer 2. The third stage of the anisotropic etching continues until the surface S1 of the second semiconductor layer 2 in the second device region 25 of the substrate 5 is exposed.

Still referring to FIG. 2, in one embodiment, the buried plate electrode 6 may be formed by ion implantation 24 of n-type or p-type dopants into the second semiconductor layer 2 of the substrate 5. The term "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. The term "n-type" refers to the addition of impurities that contribute free electrons to an intrinsic semiconductor. In a silicon-containing substrate examples of n-type dopants, i.e., impurities, include but are not limited to antimony, arsenic and phosphorous.

In one embodiment, the dopant source to produce an n-type buried plate electrode 6 may be introduced by ion-implanting an impurity, such as arsenic (As) or phosphorus (P), into the surface S1 of the second semiconductor layer 2 in the second device region 25 in the substrate 5. Arsenic (As) may be ion-injected into the surface S1 of the second semiconductor layer 2 under the conditions of an accelerating voltage, of about 40 kV, and at a dose of about $10^{15}/cm^2$. Depositing a layer of n-type doped material, such as arsenic doped silicate glass, of the surface S1 of the second semiconductor layer 2 may also form the n-type buried plate electrode 6. After the impurities are introduced to the surface S1 of the second semiconductor layer 2, the substrate 5 is typically heated in an $N_2$ nitrogen atmosphere at a temperature of about 900° C. for about 30 minutes, thereby diffusing N-type dopants into the second semiconductor layer 2 and forming the n-type buried plate electrode 6.

In another embodiment, a gaseous doping source such as $AsH_3$ or plasma doping source may also be used to dope the surface S1 of the second semiconductor layer 2 in the second device region 25 in the substrate 5 to provide the buried plate electrode 6. In another embodiment, the dopant source to provide the n-type buried plate electrode 6 is arsenic or phosphorous doped silicon dioxide glass, or arsenic or phosphorous doped polycrystalline silicon, which is deposited on the surface S1 of the second semiconductor layer 2. The dopant is driven-in to the semiconductor layer 2 to form an n+ buried plate electrode 6 from the arsenic doped silicon dioxide glass by thermal annealing. Similarly, the dopant is driven-in to the semiconductor layer 2 to form an n+ buried plate electrode 6 from the phosphorous doped polycrystalline silicon by thermal annealing.

In one embodiment, the depth of the buried plate electrode 6 may range from 5 nm to 500 nm, as measured from the surface S1 of the second semiconductor layer 2. In one example, the buried plate electrode 6 has a thickness ranging from 15 nm to 200 nm. In yet another example, the buried plate electrode 6 has a thickness ranging from 50 nm to 100 nm.

Figure 3:
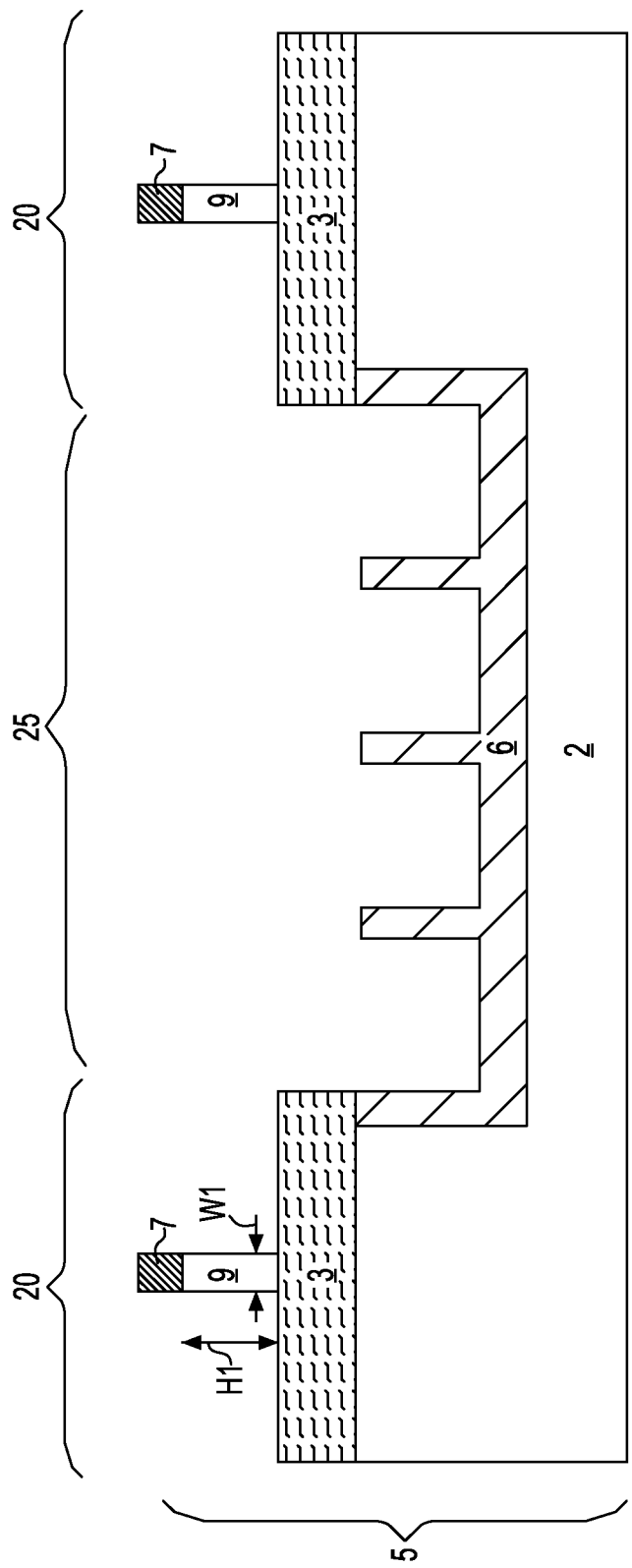
FIG. 3 is a side-cross sectional view depicting forming a fin body of a finFET semiconductor device in a first device region of the substrate, in accordance with a first embodiment of the present method.

FIG. 3 depicts etching the first semiconductor layer 4 to form a fin body 9 of a finFET semiconductor device 100 in a first device region 20 of the substrate 5, and etching the second semiconductor layer 2 in the second device region 25 of the substrate 5 to provide plateaus of semiconductor material. The fin body 9 may be formed from the first semiconductor layer 4 using photolithography and selective etching. The plateaus of semiconductor material may also be formed from the second semiconductor layer 2 using photolithography and selective etching, and may have the same pattern as the fin body 9.

Specifically, in one example, a second photoresist mask (not shown) is formed overlying the remaining portion of the at least one pad dielectric layer 7 that is present in the first device region 20 of the substrate 5, in which a portion of the at least one pad dielectric layer 7 that is underlying the second photoresist mask provides a dielectric fin cap, and a portion of the first semiconductor layer 4 that is underlying the second photoresist mask provides the fin body 9. The exposed portions of the at least one pad dielectric layer 7 and the first semiconductor layer 4, which are not protected by the second photoresist mask are removed using a selective etch process. The second photoresist mask also provides a pattern that produces the plateaus of semiconductor material from the second semiconductor material 2 in the second device region 25 of the substrate. The second photoresist mask is composed of a similar composition and is formed using a similar method as the first photoresist mask 8.

Following the formation of the second photoresist mask, a selective etching process may remove the unprotected portions of the at least one gate dielectric layer 7 selective to the first semiconductor layer 4 in the first device region 20, followed by removing the unprotected portion of the first semiconductor layer 4 selective to the underlying buried insulating layer 3 to define the fin body 9. The selective etching process may also recess the exposed surfaces of the second semiconductor layer 2 in the second device region 20 to provide the plateaus of semiconductor material. The depth at which the exposed surfaces of the second semiconductor layer 2 is etched may be controlled by timing the selective etch process.

Transferring of the pattern provided by the second photoresist mask into the underlying structures may include an anisotropic etch. The anisotropic etch may include reactive-ion etching (RIE). Other examples of anisotropic etching that can be used at this point of the present invention include ion beam etching, plasma etching or laser ablation.

Alternatively, the fin body 9 can be formed by sidewall imaging transfer (SIT) technique.

The fin body 9 may have a height $H_1$ ranging from 5 nm to 200 nm. In one embodiment, the fin body 9 has a height $H_1$ ranging from 10 nm to 100 nm. In another embodiment, the fin body 9 has a height $H_1$ ranging from 20 nm to 50 nm. In one embodiment, the fin body 9 has a width $W_1$ of less than 30 nm. In another embodiment, the fin body 9 has a width $W_1$ ranging from 3 nm to 20 nm. In another embodiment, the fin body 9 has a width $W_1$ ranging from 10 nm to 15 nm. The plateaus of the semiconductor material may have the same dimensions as the fin body 9. It is noted that other dimensions for the fin body 9 have also contemplated, so long as the dimensions of the fin body 9 provides for a channel that may be fully depleted of charge carriers when the finFET semiconductor device is in the off state. In some embodiments, a fully depleted semiconductor device is a semiconductor device in which the film thickness of the channel layer of the semiconductor device is less than the maximum depletion width.

Figure 4:
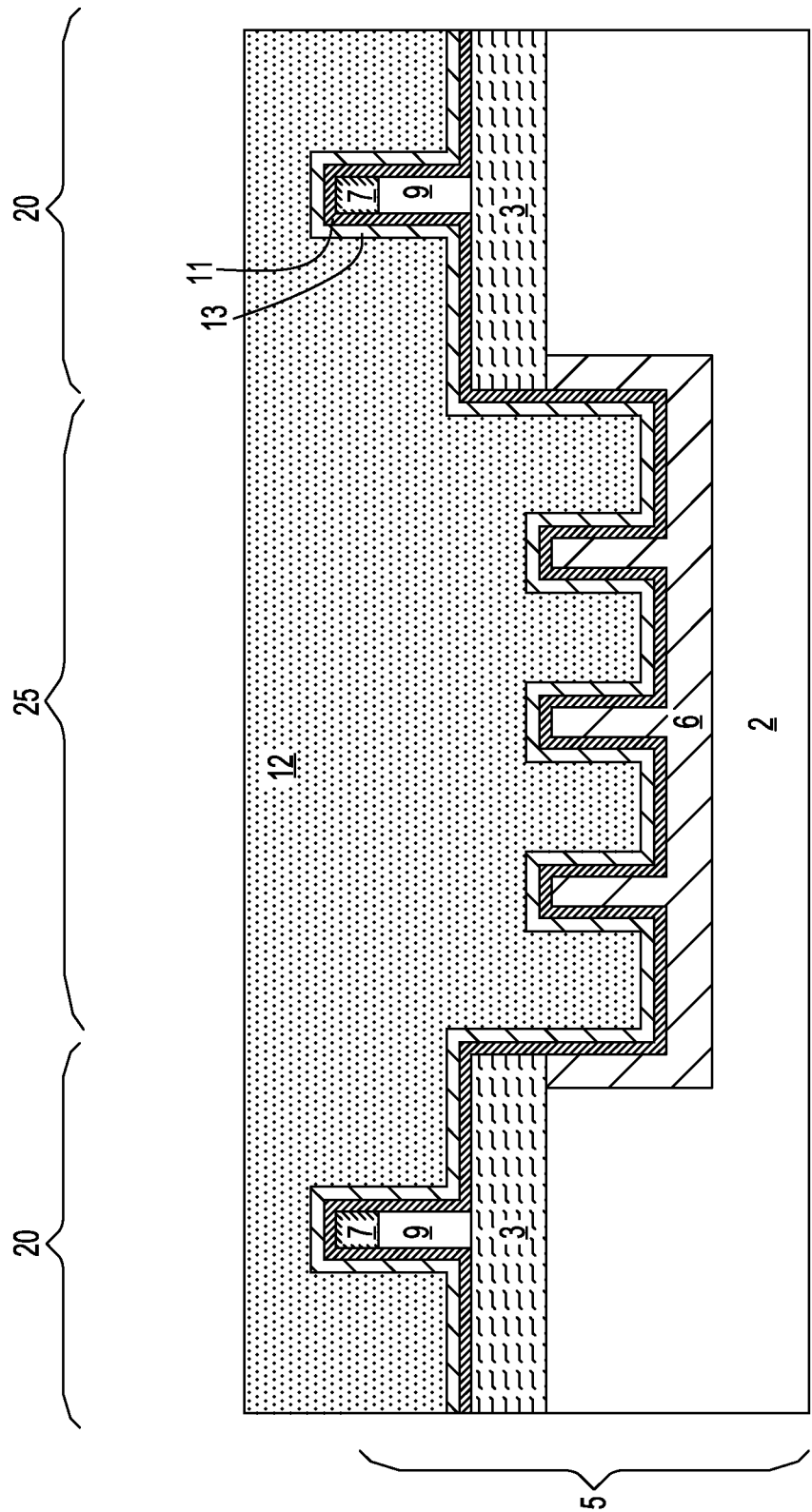
FIG. 4 is a side-cross sectional view depicting conformally depositing a node dielectric layer over the first device region and the second device region of the substrate, and forming an upper electrode material over the node dielectric layer, in accordance with a first embodiment of the present method.

FIG. 4 depicts one embodiment of conformally depositing a material layer for the node dielectric 11 over the first device region 20 and the second device region 25 of the substrate 5, and forming an upper electrode material 12 over the node dielectric 11. The term "conformal" or "conformally deposited" denotes a layer having a thickness that does not deviate from greater than or less than 20% of an average value for the thickness of the layer. In one embodiment, the node dielectric 11 is deposited on the sidewalls of the buried insulating layer 3 that are exposed by the etch that removes the first semiconductor layer 4 and the buried insulating layer 3 from the second device region 25. The node dielectric 11 may also be formed on the vertical sidewall portions of the second semiconductor layer 2 that are formed by the etch process that produces the plateaus of semiconductor material from the second semiconductor layer 2. The node dielectric 11 may also be present on the recessed base portions of the second semiconductor layer 2 that are present between the plateaus of semiconductor material.

The node dielectric 11 may be a dielectric material, such as silicon oxide ($SiO_2$), silicon nitride, silicon oxynitride, or alternatively a high-k dielectrics. In one embodiment, the high-k dielectric of the node dielectric 11 has a dielectric constant greater than about 4.0, e.g., 4.1. In another embodiment, the high-k dielectric of the node dielectric 11 has a dielectric constant greater than 7.0. In yet another embodiment, the high-k material of the node dielectric 11 has a dielectric constant ranging from greater than 4.0 to 30. The dielectric constants mentioned herein are relative to a vacuum. Some examples of high-k dielectric materials suitable for the node dielectric 11 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the node dielectric 11 may be formed by a thermal growth process such as, for example, oxidation, nitridation or oxynitridation. The node dielectric 11 may also be formed by a deposition process such as for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. The node dielectric 11 may also be formed utilizing any combination of the above processes. In one embodiment, the node dielectric 11 has a thickness ranging from 1 nm to 10 nm. In another embodiment, the node dielectric 11 has a thickness ranging from 1.5 nm to 5 nm.

The upper electrode material 12 may be composed of a conductive semiconductor material, such as n-type or p-type doped silicon, silicon germanium, and/or germanium. The upper electrode material 12 may be amorphous or polycrystalline. In another example, the upper electrode material 12 may be composed of a metal or metallic compound. Any conductive metal may be suitable for the upper electrode material 12 including, but not limited to W, Ni, Ti, Mo, Ta, Cu, Pt, Ag, Au, Ru, Ir, Rh, and Re, and alloys that include at least one of the aforementioned conductive elemental metals. In one embodiment, a metal nitride layer 13 may be present between the upper electrode material 12 and the dielectric layer 11. In one example, the metal nitride may be TaN, TiN, WN or a combination thereof.

The upper electrode material 12 may be formed utilizing a deposition process, such as physical vapor deposition (PVD), CVD, plating, sputtering, atomic layer deposition (ALD), or evaporation. The physical thickness of the upper electrode material 12 may vary, but typically, the upper electrode material 12 has a thickness ranging from 1 nm to 100 nm. In another embodiment, the gate conductor material 12 has a thickness ranging from 1 nm to 50 nm. In one embodiment, following deposition, the upper surface of the upper electrode material 12 is planarized. In one example, the planarization process is provided by chemical mechanical planarization (CMP). "Chemical Mechanical Planarization" is a material removal process using both chemical reactions and mechanical forces to remove material and planarize a surface.

Figure 5:
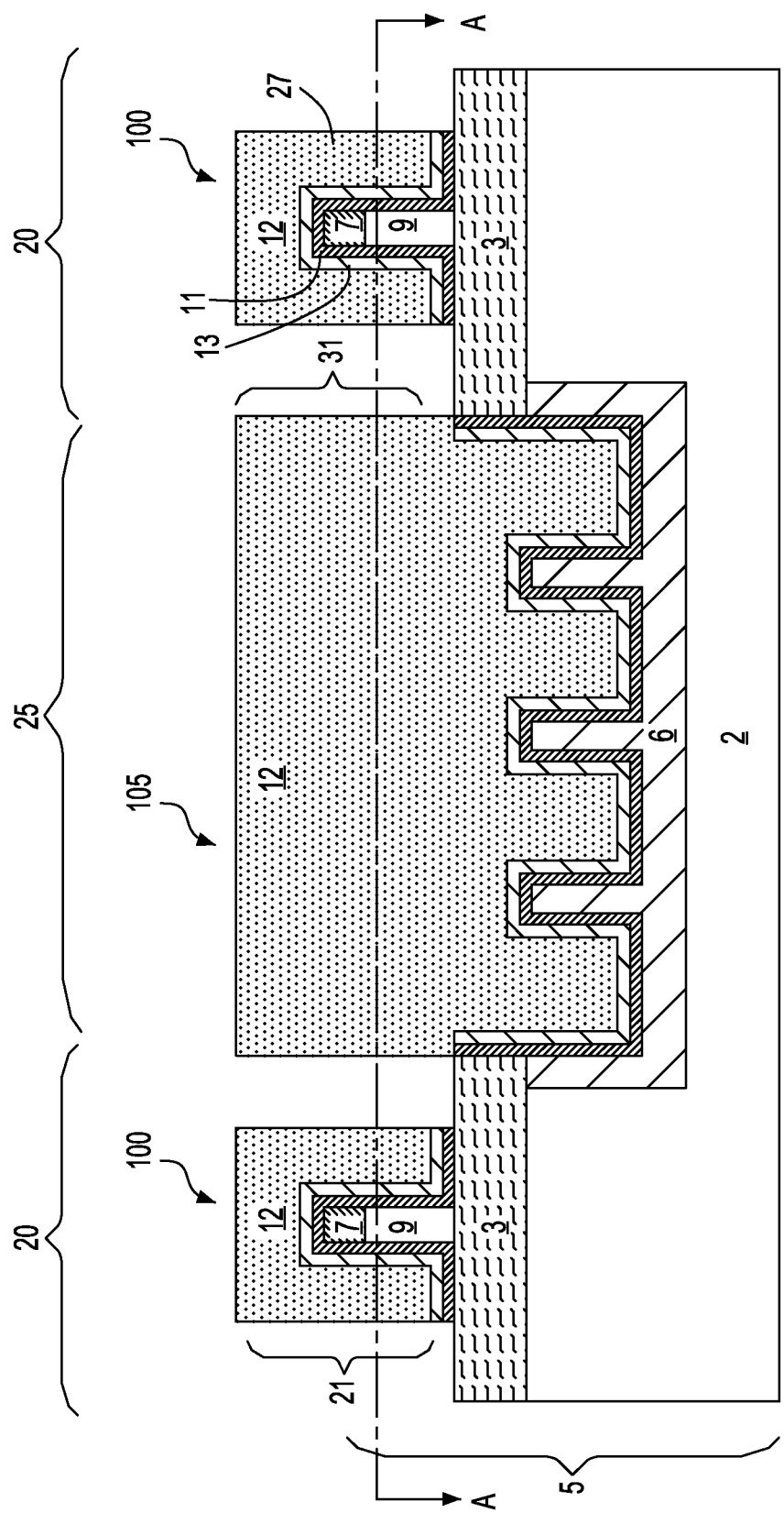
FIG. 5 is a side cross-sectional view depicting patterning the upper electrode material and the conformally deposited node dielectric to provide a capacitor on the second device region, and forming a finFET semiconductor device on the first device region, in accordance with a first embodiment of the present method.

FIG. 5 depicts one embodiment of patterning the upper electrode material 12 and the node dielectric 11 to provide a capacitor 105 on the second device region 25, and forming a finFET semiconductor device 100 on the first device region 20. The upper electrode material 12 and the node dielectric 11 that is present in the first device region 20 may be patterned and etched to provide a gate structure 21 that is in direct contact with the fin body 9 of the finFET semiconductor device 100. Gate structure 21 is a structure used to control output current (i.e., flow of carriers in the channel) of a semiconducting device through electrical or magnetic fields. The node dielectric 11 that is patterned to provide the gate structure 21 provides the gate dielectric 26 of the finFET semiconductor device 100. The upper electrode material 12 that is patterned to provide the gate structure 21 provides the gate conductor 27 of the finFET semiconductor device 100. The upper electrode material 12 and the node dielectric 11 that are present in the second device region 25 may be patterned and etched to provide a capacitor stack 31 in direct contact with the buried plate electrode 6 of the capacitor 105. The gate structure 21 of the finFET semiconductor device 100 is physically separated from the capacitor stack 31 of the capacitor 105. The capacitor stack 31 may extend over the entirety of the etched portion of the second semiconductor layer 2.

The gate structure 21 and the capacitor stack 31 may be formed from the upper electrode material 12 and the node dielectric 11 using photolithography and selective etching. Specifically, in one example, a third photoresist mask (not shown) is formed overlying the upper electrode material 12 and the node dielectric 11. The portions of the upper electrode material 12 and the node dielectric 11 that are underlying the third photoresist mask provide the gate structure 21, and the capacitor stack 22. The third photoresist mask is composed of a similar composition, and is formed using a similar method, as the first photoresist mask 8 that is described above with reference to FIG. 2. The exposed portions of the upper electrode material 12 and the node dielectric 11, which are not protected by the third photoresist mask are removed by a selective etch process. The selective etching process may remove the unprotected portions of the upper electrode material 12 selective to the node dielectric 11. In a following etch step, the unprotected portion of the node dielectric 11 is removed by an etch chemistry that is selective to the underlying buried insulating layer 3.

Referring to FIG. 6, the source and drain regions, i.e., source regions 14, drain regions 15, and extension regions, are formed in direct contact with the fin body 9 in the first device region 20 of the substrate 5. During the formation of the source regions and the drain regions, the second device region 25 may be protected by a block mask, such as a photoresist block mask. The block mask is composed of a similar material, and is formed using a similar method as the first photoresist mask 8.

A set of dielectric spacers 23 can be formed in direct contact with the sidewalls of the gate structure 21. The dielectric spacers 23 are typically narrow having a width ranging from 2.0 nm to 15.0 nm. The dielectric spacers 23 can be formed using deposition and etch processing steps. The dielectric spacers 23 may be composed of a dielectric, such as nitride, oxide, oxynitride, or a combination thereof. The thickness of the dielectric spacers 23 determines the proximity of the subsequently formed source regions 14 and drain regions 15 to the channel of the finFET semiconductor device 100.

An in-situ doped semiconductor material may be formed on exposed surfaces of the fin body 9 that is adjacent to the gate structure 21 to provide source region 14 and the drain region 15. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

In one embodiment, the in-situ doped semiconductor material is formed using an epitaxial growth process. "Epitaxial growth and/or deposition" means the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the first semiconductor layer 4 with sufficient energy to move around on the surface and orient themselves to the crystal arrangement of the atoms of the deposition surface. Thus, an epitaxial film deposited on a <111> crystal surface will take on a <111> orientation. If, on the other hand, the wafer surface has an amorphous surface layer, possibly the result of implanting, the depositing atoms have no surface to align to, resulting in the formation of polysilicon instead of single crystal silicon. A number of different sources may be used for the deposition of epitaxial silicon. For example, the in-situ doped semiconductor material may be single crystal silicon. Silicon sources for epitaxial growth include silicon tetrachloride, dichlorosilane ($SiH_2Cl_2$), and silane ($SiH_4$). The temperature for epitaxial silicon deposition typically ranges from 750° C. to 900° C. Although higher temperatures typically result in faster deposition, the faster deposition may result in crystal defects and film cracking.

In one embodiment, the in-situ doped semiconductor material may be provided by selective-epitaxial growth of SiGe atop the first semiconductor layer 4 of the fin body 9. The Ge content of the epitaxial grown SiGe may range from 5% to 50%, by atomic weight %. In another embodiment, the Ge content of the epitaxial grown SiGe may range from 10% to 20%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In one embodiment, the epitaxial grown SiGe produces a compressive strain in the portion of the first semiconductor layer 4, in which the channel of a semiconductor device, such as a pFET device, is subsequently formed. In another embodiment, the in-situ doped semiconductor material is composed of epitaxially grown Si:C or carbon doped silicon. The carbon (C) content of the epitaxial grown Si:C ranges from 0.5% to 3%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown. In one embodiment, the epitaxial grown Si:C produces a tensile strain in the first semiconductor layer 4, in which the channel of a semiconductor device, such as a nFET device, is subsequently formed.

In one embodiment, the in-situ doped semiconductor material is doped during the epitaxial growth process. P-type MOSFET devices are produced by doping the in-situ doped semiconductor material with elements from group III of the Periodic Table of Elements. In one embodiment, the group III element is boron, aluminum, gallium or indium. In one example, in which the in-situ doped semiconductor material is doped to provide a p-type conductivity, the dopant may be boron present in a concentration ranging from $1\times10^{19}$ atoms/$cm^3$ to $2\times10^{21}$ atoms/$cm^3$. In one example, the in-situ doped semiconductor material is composed of SiGe and is doped with boron to provide the raised source region and raised drain region of a p-type conductivity field effect transistor. N-type MOSFET devices are provided by elements from group V of the Periodic Table of Elements. In one embodiment, the group V element is phosphorus, antimony or arsenic. In addition to forming in-situ doped semiconductor material for the raised source and drain regions, the raised source and drain regions may also be formed using epitaxial growth in combination with ion implantation of n-type or p-type dopants.

In one embodiment, a dopant from the in-situ doped semiconductor material is diffused into the first semiconductor layer 4 to form extension regions. In one embodiment, the dopant from the in-situ doped semiconductor material is diffused into the first semiconductor layer 4 by an annealing process including, but not limited to rapid thermal annealing, furnace annealing, flash lamp annealing or laser annealing. In one embodiment, thermal annealing to diffuse the dopant from the in-situ doped semiconductor material into the first semiconductor layer 4 is conducted at a temperature ranging from about 850° C. to about 1350° C.

In one embodiment, in which in-situ doped semiconductor material is doped to a p-type conductivity, the extension regions that are formed in the first semiconductor layer 4 have a p-type conductivity. Typically, the dopant concentration of the extension regions having the p-type conductivity ranges from $1\times10^{19}$ atoms/$cm^3$ to $5\times10^{20}$ atoms/$cm^3$. In another embodiment, the extension regions having the p-type conductivity ranges from $1\times10^{19}$ atoms/$cm^3$ to $2\times10^{20}$ atoms/$cm^3$. In another embodiment, in which the in-situ doped semiconductor material is doped to an n-type conductivity, the extension regions that are formed in the first semiconductor layer 4 have an n-type conductivity. Typically, the dopant concentration of the extension regions having the n-type conductivity ranges from $1\times10^{19}$ atoms/$cm^3$ to $5\times10^{20}$ atoms/$cm^3$. In another embodiment, the extension regions having the n-type conductivity ranges from $3\times10^{19}$ atoms/$cm^3$ to $2\times10^{20}$ atoms/$cm^3$.

Referring to FIGS. 5 and 6, in one embodiment, the integrated circuit includes a substrate 5 having a first device region 20 and a second device region 25. The first device region 15 of the substrate 5 includes a first semiconductor layer 4 that is present on a buried insulating layer 3. The buried insulating layer 3 is present on a second semiconductor layer 2 of the substrate 5. The second device region 25 includes the second semiconductor layer 2, but the first semiconductor layer 4 and the buried insulating layer 3 are not present in the second device region 25. A finFET semiconductor device 100 is present in the first device region 20 of the substrate 5, in which the first semiconductor layer 4 provides the fin body 9 of the finFET semiconductor device 100. A capacitor 105 is present in the second device region 25. The capacitor 105 includes the buried plate electrode 6, the node dielectric 11 and the upper electrode material 12, i.e., upper electrode. The buried plate electrode 6 is present in the second semiconductor layer 2 of the substrate 5. The node dielectric 11 is present on an upper surface of the buried plate electrode 6, and the upper electrode 12 is present on the node dielectric 11.

In some embodiments, the capacitor 105 has enhanced capacitance, i.e., increased capacitance, when compared to conventional planar capacitors that is due to the three dimensional structure that is depicted in FIGS. 5 and 6. More specifically, the plateaus of semiconductor material in the buried plate electrode 6 of the capacitor 105 provide increased surface area between the node dielectric 11 and the buried plate electrode 6, as well as the upper electrode 12. The capacitor 105 including the plateaus of semiconductor material may be referred to as having a three dimensional geometry. In conventional planar semiconductor devices, in which the plateaus are not present, the surface area between the node dielectric, the buried plate electrode and the upper electrode is reduced, when compared to capacitors 105 having the three dimensional geometry that is depicted in FIGS. 5 and 6. In light of the increased surface area between the node dielectric 11, the buried plate electrode 6 and the upper electrode, the three dimensional capacitor 105 can provide an increase in capacitance ranging from 50% to 150% when compared to a conventional planar capacitor having the same footprint. In yet another embodiment, the increase in capacitance provided by the three dimensional capacitor 105 ranges from 75% to 100% when compared to a conventional planar capacitor having the same footprint. In some embodiments, the three dimensional capacitor 105 is also very cost effective to produce. The capacitor 105 and the finFET semiconductor device 100 typically share the same material layer for the upper electrode 12 of the capacitor 105 and the gate conductor for the finFET semiconductor device 105. The capacitor 105 and the finFET semiconductor device 100 can also share the same material layer for the node dielectric 11 of the capacitor 105 and the gate dielectric for the finFET semiconductor device 105.

FIGS. 7-10 depict a method for forming an integrated circuit that includes a planar semiconductor device 101 and a capacitor 105 present on a semiconductor on insulator (SOL) substrate 5, in which the first semiconductor layer 4, i.e., SOI layer, of the SOI substrate 5 has a thickness that is no greater than 10 nm.

FIG. 7 depicts thinning the first semiconductor layer 4 of the semiconductor on insulator (SOI) substrate 5 that is depicted in FIG. 1 to provide an extremely thin semiconductor on insulator (ETSOI) layer. Typically, the first semiconductor layer 4 is thinned T1 to a thickness that can be no greater than 10 nm. The first semiconductor layer 4 may be thinned to a desired thickness by planarization, grinding, wet etch, dry etch or any combination thereof. One method of thinning the first semiconductor layer 4 is to oxidize the upper surface of the first semiconductor layer 4, e.g., a silicon-containing upper surface, by a thermal dry or wet oxidation process, and then wet etch the oxide layer using a hydrofluoric acid mixture. This process can be repeated to achieve the desired thickness. In one embodiment, the first semiconductor layer 4 is thinned to a thickness T1 ranging from 1.0 nm to 10.0 nm. In another embodiment, the first semiconductor layer 4 has a thickness T1 ranging from 1.0 nm to 5.0 nm. In a further embodiment, the first semiconductor layer 4 has a thickness T1 ranging from 3.0 nm to 8.0 nm. It is noted that other dimensions for first semiconductor layer 4 are also contemplated, so long as the dimensions of the first semiconductor layer 4 provides for a channel that may be fully depleted when the ETSOI semiconductor device is in the "off" state.

FIG. 7 further depicts forming isolation regions 1 in the semiconductor on insulator substrate 5 to define a first device region 20 and a second device region 25. In one embodiment, the isolation regions 1 may be formed extending through the first semiconductor layer 4 stopping on the buried insulating layer 3. In one embodiment, the isolation regions 1 are formed by etching a trench into the substrate 5 utilizing an anisotropic etching process, such as reactive-ion etching (RIE) or plasma etching. The trenches may optionally be lined with a liner material, e.g., an oxide, and then CVD or another like deposition process is used to fill the trench with polysilicon or another like STI dielectric material, such as an oxide, nitride or oxynitride. The STI dielectric may optionally be densified after deposition. A planarization process, such as chemical-mechanical polishing (CMP), may optionally be used to provide a planar structure, as depicted in FIG. 7. Besides STI isolation, isolation regions 1 can be formed by other isolation techniques, including but not limited to, mesa isolation, local oxidation of silicon (LOCOS) isolation, etc.

FIG. 8 depicts removing the first semiconductor layer 4 and the buried insulating layer 3 from the second device region 25 of the substrate 5 to expose a surface S1 of the second semiconductor layer 2, and forming a buried plate electrode 6 in the second semiconductor layer 2. In one embodiment, the first semiconductor layer 4 and the buried insulating layer 3 are removed from the second device region 25 using a first photoresist mask 8, and a selective etch process.

The first photoresist mask 8 is formed over and protecting the first device region 20 of the substrate 5, while exposing the second device region 25. The first photoresist mask 8 may be composed of a similar material, and may be formed using a similar process, as the first photoresist mask 8 that is described above in reference to FIG. 2.

Following the formation of the first photoresist mask 8, a selective etch process may remove the unprotected portions of the first semiconductor layer 4 and the buried insulating layer 3 selective to the second semiconductor layer 2 of the substrate 5. In one example, the transferring of the pattern provided by the first photoresist mask 8 into the substrate 5 may include an anisotropic etch, such as reactive-ion etching (RIE). Other examples of anisotropic etching that can be used at this point of the present invention include ion beam etching, plasma etching or laser ablation. Following etching, the upper semiconductor surface of the first device region 20 is vertically offset from the upper semiconductor surface of the second device region 25. In one embodiment, the upper semiconductor surface of the first device region 20 is vertically offset from the upper semiconductor surface of the second device region 25 by a dimension ranging from 10 nm to 50 nm.

Still referring to FIG. 8, in one embodiment, the buried plate electrode 6 may be formed by ion implantation of n-type or p-type dopants into the second semiconductor layer 2 of the substrate 5. The buried plate electrode 6 that is depicted in FIG. 8 may be formed using similar methods, and may be composed of similar dopants, as the buried plate electrode 6 that is described above with reference to FIG. 2. In one embodiment, the depth of the buried plate electrode 6 may range from 15 nm to 500 nm, as measured from the surface S1 of the second semiconductor layer 2. In one example, the buried plate electrode 6 has a thickness ranging from 50 nm to 100 nm.

Figure 9:
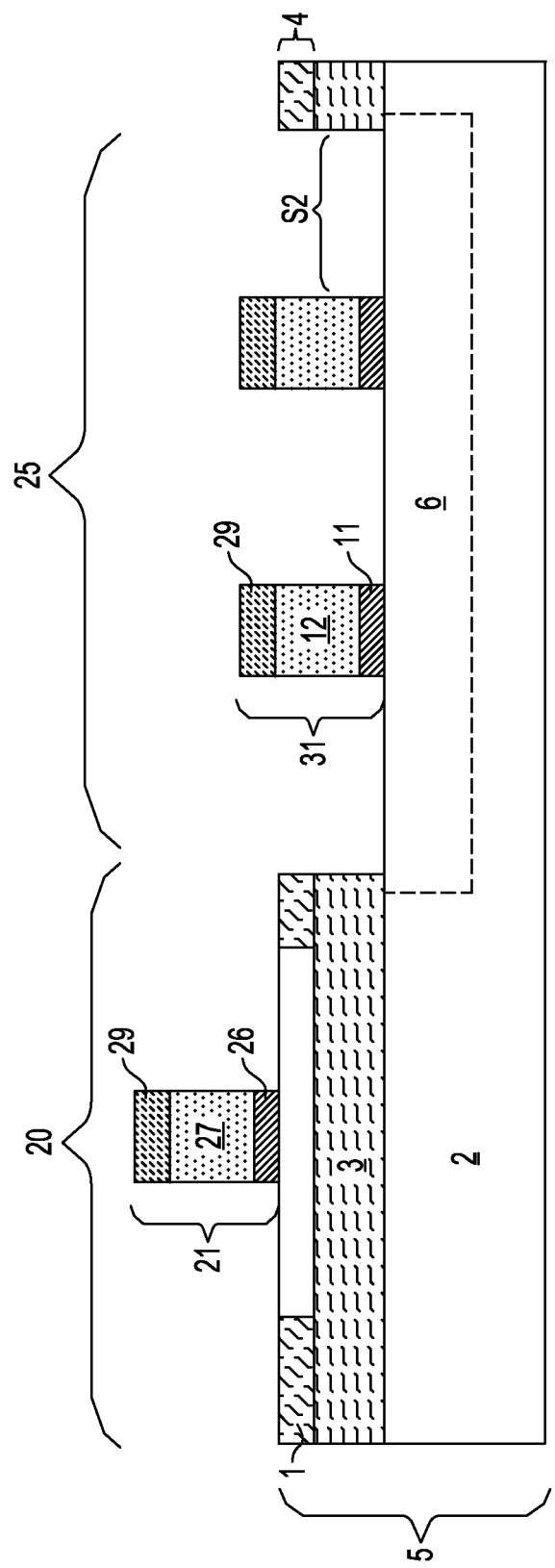
FIG. 9 is a side cross-sectional view depicting forming the gate structure of a planar semiconductor device in the first device region of the substrate, and forming capacitor stacks composed of an upper electrode and a node dielectric in the second device region of the substrate, in accordance with a second embodiment of the present method.

FIG. 9 depicts forming the gate structure 21 of a planar semiconductor device in the first device region 20 of the substrate 5, and forming capacitor stacks 31 composed of an upper electrode material 12 and a node dielectric 11 in the second device region 25 of the substrate 5.

The gate structure 21 and the capacitor stacks 31 can be formed using deposition, photolithography and selective etching process. In one example, material layers for the gate dielectric 26 and the gate conductor 27 of the gate structures 21, and the material layers for the node dielectric 11 and the upper electrode material 12 of the capacitor stack 31, are first blanket deposited on the first device region 20 and the second device region 25 of the substrate 5. In one embodiment, the material layer that provides the gate dielectric 26 is the same material layer that provides the node dielectric 11, and the material layer that provides the gate conductor 27 is the same material layer that provides the upper electrode material 12. In another embodiment, the material layer that provides the gate dielectric 26 is a different material layer that has a different composition than the material layer that provides the node dielectric 11, and the material layer that provides the gate conductor 27 is a different material layer that has a different composition than the material layer that provides the upper electrode material 12.

Following deposition, the material layers are patterned and etched to provide the gate structure 21 and the capacitor stacks 31 using photolithography and selective etch techniques similar to those described above with reference to FIG. 5. In one embodiment, a hard mask (hereafter referred to as a dielectric cap 29) may be used to form the gate structure 30 and the capacitor stacks 31. The dielectric cap 29 may be formed by first depositing a dielectric hard mask material, like silicon nitride or silicon oxide, atop the material layer that provides the upper electrode material 12 and the gate conductor 27, and then applying a photoresist pattern to the hard mask material using a lithography process steps. The photoresist pattern is transferred into the hard mask material using a dry etch process forming the dielectric cap 29. Next, the photoresist pattern is removed and the dielectric cap 29 pattern is transferred into the material layer that provides the gate conductor 27 of the gate structure 30, and the upper electrode material 12 of the capacitor stack 31 during a selective etching process.

In one embodiment, the material layers that provide the upper electrode material 12 and the node dielectric 11 of the capacitors stacks 31 may be patterned to produce multiple capacitor stacks 31 in the second device region 25 of the substrate 5. In this embodiment, an exposed surface S2 of the second semiconductor layer 2 is present between the portions of the second semiconductor layer 2 on which adjacent capacitor stacks 31 are present.

The material layer that provides the gate conductor 27 and the upper electrode material 12 may be a doped semiconductor material or may be composed of a metal. For example, the upper electrode material 12 and the gate conductor 27 may each be composed of a silicon-containing semiconductor material, e.g., single crystal silicon or polycrystalline silicon, which is doped with n-type or p-type dopants. The upper electrode material 12 and the gate conductor 27 may also be composed of a metal including, but not limited to W, Ni, Ti, Mo, Ta, Cu, Pt, Ag, Au, Ru, Ir, Rh, and Re, and alloys that include at least one of the aforementioned conductive elemental metals. The gate conductor 27 and the upper electrode material 12 may also be composed of metal nitrides of the aforementioned materials. Some examples of suitable metal nitrides include WN, TiN and TaN. In some embodiments, the gate conductor 27 and the upper electrode material 12 are composed of multi-layers of conductive materials. For example, each of the gate conductor 27 and the upper electrode material 12 may be composed of a semiconductor material atop a metal layer or metal nitride layer.

Each of the gate dielectric 26 and the node dielectric 11 may be a dielectric material, such as $SiO_2$, or a high-k dielectric. The materials describe above for the node dielectric that is described in reference to FIG. 4 is suitable for the dielectric material of the gate dielectric 26 and the node dielectric 11 that is consistent with the embodiments illustrated in FIG. 9. In one embodiment, the gate dielectric 26 and the node dielectric 11 each have a thickness ranging from 1 nm to 10 nm. In another embodiment, the gate dielectric 26 and the node dielectric 11 each have a thickness ranging from 1.5 nm to 2.5 nm. Although, the thickness of the gate dielectric 26 and the node dielectric 11 are typically the same, embodiments have been contemplated in which the thickness of the gate dielectric 26 and the node dielectric 11 are different.

Figure 10:
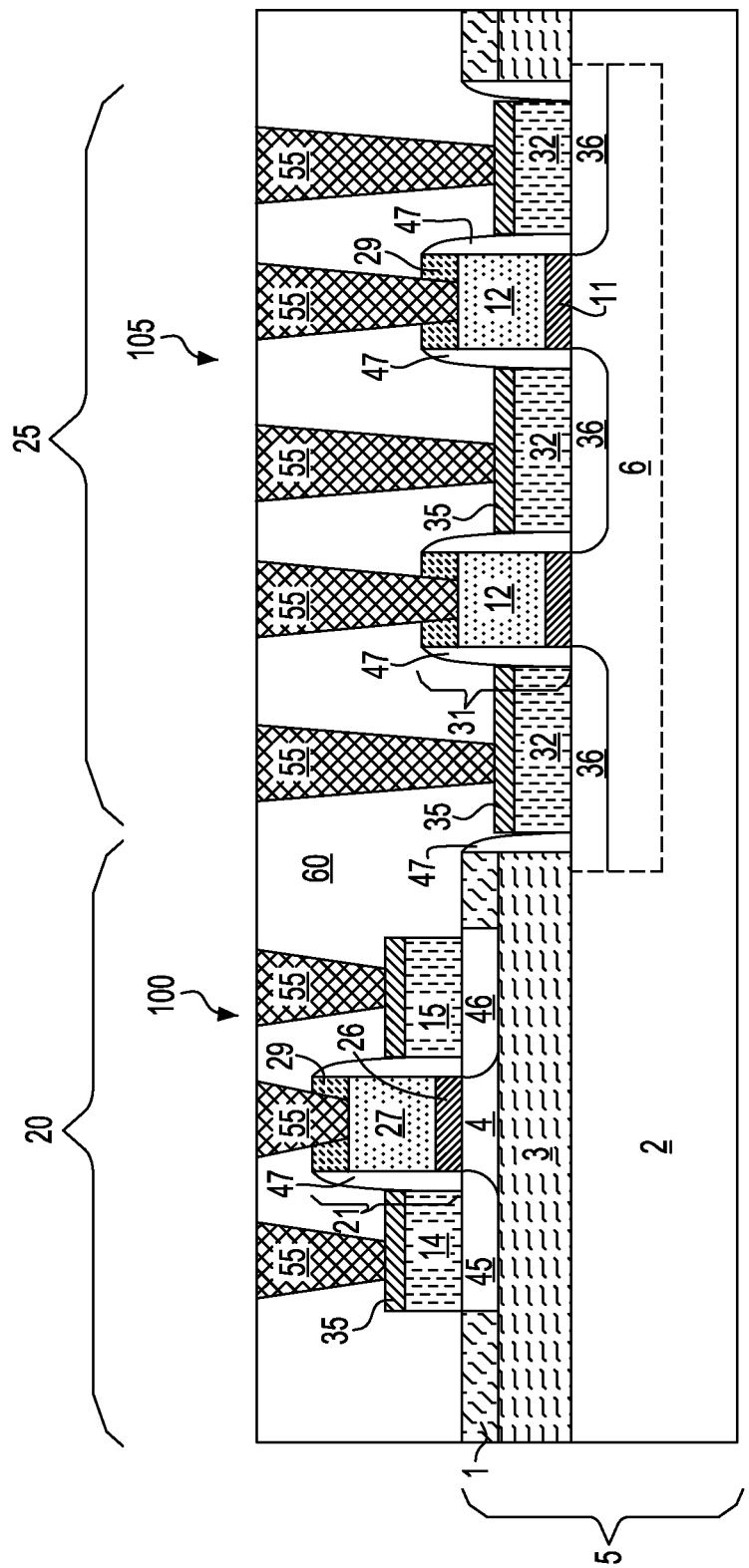
FIG. 10 is a side cross-sectional view depicting forming source and drain regions to the planar semiconductor device in the first device region of the substrate, and forming contacts to the planar semiconductor device and the capacitor, in accordance with a second embodiment of the present method.

Referring to FIG. 10, following the formation of the gate structure 21 and the capacitor stack 31, source and drain regions may be formed for the planar semiconductor device 101, and contacts may be formed to the planar semiconductor device 101 and the capacitor 105. In one example, the source and drain regions to the planar semiconductor device 101 include source extension regions 45 and drain extension regions 46, as well as raised source regions 14 and raised drain regions 15. In one embodiment, the contacts to the planar semiconductor device 101 include metal semiconductor alloy regions 35 on the upper surface of the source and drain regions, e.g., raised source and drain regions, and interconnects 55 to the source and drain regions and the gate conductor 27 of the planar semiconductor device 101.

In one embodiment, the contacts to the capacitor 105 include a conductive doped region 36 in the surface S2 of the second semiconductor layer 2 that is present between the capacitor stacks 31. The contacts to the capacitor 101 may further include an epitaxial semiconductor contact region 32 including a metal semiconductor alloy region 35 on the upper surface of the epitaxial semiconductor contact region 32. The conductive doped region 36 and the epitaxial semiconductor contact region 32 provide electrical contact to the buried plate electrode 6 of the capacitor 105. The contacts to the capacitor 105 may also include interconnects 55 that are formed to the upper semiconductor material 12 of the capacitor stack 31, and to the metal semiconductor alloy region 35 that is present on the epitaxial semiconductor contact region 32.

The formation of the source and drain extension regions 45, 46 of the planar semiconductor device 101 may be formed at the same time as the conductive doped region 36 of the capacitor 105. In other embodiments, the source and drain extension regions 45, 46 may be formed separate from the conductive doped region 36 of the capacitor by utilizing block masks, such as photoresist block masks.

In one embodiment, the source and drain extension regions 45, 46 may be formed using an ion implantation process. The conductivity of the dopant selected for the source and drain extension regions 45, 46 dictates the conductivity of the resultant planar semiconductor device 101. In one example, of a p-type planar semiconductor device 101, when forming source and drain extension regions 45, 46 the dopant species may be boron or $BF_2$. Boron may be implanted utilizing implant energies ranging 0.2 keV to 3.0 keV with an implant dose ranging from $3 \times 10^{14}$ atoms/cm$^2$ to $5 \times 10^{15}$ atoms/cm$^2$. $BF_2$ may be implanted utilizing implant energies ranging from 1.0 keV to 15.0 keV and having an implant dose ranging from $3 \times 10^{14}$ atoms/cm$^2$ to $5 \times 10^{15}$ atoms/cm$^2$. In another example, in which the planar semiconductor device 101 is an n-type device, the source and drain extension regions 45, 46 may be implanted with at least one of antimony, arsenic and phosphorous using similar implant doses and implant energies as described above for forming the source and drain extension regions 45, 46 of a p-type planar semiconductor device 101.

The conductive doped region 36 is typically doped having the same conductivity type as the buried plate electrode 6, but the conductive doped region 36 typically has a higher concentration of dopant than the buried plate electrode. The conductive doped region 36 is typically implanted using ion implantation with implant energies and concentrations similar to those used to form the source and drain extension regions 45, 46. In one embodiment, in which the buried plate electrode 6 is doped to an n-type conductivity, the conductive doped region 36 is also doped to a p-type conductivity region. In the embodiments, in which the conductive doped region 36 has a different conductivity type as the source and drains regions 45, 46, block masks may be implemented to select the regions of the substrate 5 being doped.

Still referring to FIG. 10, at least one spacer 47 may be formed in direct physical contact with the sidewalls of the gate structure 21 to the planar semiconductor device 101, the sidewalls of the capacitor stacks 31, and the sidewall of the first device region 20. The at least one spacer 47 may be composed of oxide, i.e., silicon oxide, but may also comprise any dielectric material, such as nitride or oxynitride materials. Each spacer 47 may have a width ranging from 50.0 nm to 100.0 nm. The at least one spacer 47 can be formed by deposition and etch processes. For example, a conformal dielectric layer may be deposited using deposition processes, including, but not limited to, chemical vapor deposition (CVD), plasma-assisted CVD, and low-pressure chemical vapor deposition (LPCVD). Following deposition, the conformal dielectric layer is then etched to define the geometry of the spacer 11 using an anisotropic plasma etch procedure such as, reactive ion etch.

The formation of the raised source region 14 and the raised drain region 15 of the planar semiconductor device 101 may be formed at the same time as the epitaxial semiconductor contact region 32 of the capacitor 105. In other embodiments, the source and drain extension regions 45, 46 may be formed separate from the epitaxial semiconductor contact region 32 by utilizing block masks, such as photoresist block masks.

In one embodiment, raised source region 14 and the raised drain region 15 may be formed atop the exposed surfaces of the first semiconductor layer 4 on opposing sides of the gate structure 21 to the planar semiconductor device 101. The thickness of the spacer 47 determines the proximity of the raised source region 14 and raised drain region 15 to the channel of the planar semiconductor device 101. In one embodiment, the raised source and drain regions 14, 15 are formed using an epitaxial growth process. A number of different sources may be used for the deposition of epitaxial silicon. The raised source and drain regions 14, 15 may be formed of single crystal silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. The raised source and drain regions 14, 15 may also be composed of SiGe and Si:C. The methods of forming epitaxial SiGe and Si:C that is described above with reference to FIG. 5 are suitable for the raised source and drain regions 14, 15 that are depicted in FIG. 10.

In some embodiments, the raised source and drain regions 14, 15 may be in-situ doped during the epitaxial growth process. The dopant introduced to the raised source and drain regions 14, 15 typically dictates the conductivity of the planar semiconductor device 101, and typically the conductivity of the dopant to the raised source and drain regions 14, 15 is the same as the conductivity of the extension source region 45 and the extension drain region 46. For example, when the extension source region 45 and the extension drain region 46 are doped to an n-type conductivity, the raised source region 14 and the raised drain region 15 are typically doped to an n-type conductivity. The dopant species, concentration and method of doping that is described above with respect to FIG. 5 are suitable for the raised source and drain regions 14, 15 that are illustrated in FIG. 10.

The epitaxial semiconductor contact region 32 of the capacitor 105 may be formed simultaneously with the raised source region 14 and the raised drain region 15 using the same epitaxial growth process. Therefore, similar to the raised source region 14 and the raised drain region 15, the epitaxial semiconductor contact region 32 may be composed of single crystal Si, Si:C or SiGe. Further, the epitaxial semiconductor contact region 32 may be doped to the same conductivity with the same dopant species and concentration as the raised source and drain region 14, 15. In one embodiment, in which the buried plate electrode 6 is doped to an n-type conductivity and the conductive doped region 36 is also doped to a n-type conductivity region, the epitaxial semiconductor contact region 32 may also be doped to an n-type conductivity. In some embodiments, the epitaxial semiconductor contact region 32 has a different conductivity type as the raised source and drains regions 14, 15, block masks may be implemented to select the regions of the substrate 5 being doped.

The epitaxial semiconductor contact region 32 is formed on the surface S2 of the second semiconductor layer 2 that is between capacitor stacks 31. The epitaxial semiconductor contact region 32 provides electrical communication to the buried plate electrode 6. The epitaxial semiconductor contact region 32 is separated from the upper electrode material 12 of the capacitor stack by the at least one spacer 47.

In one embodiment, in which the source and drain extension regions 45, 46 have not been introduced by ion implantation, dopant diffused from raised source and drain regions 14, 15 into the first semiconductor layer 4 provides the source and drain extension regions 14, 15. In one embodiment, in which the conductive doped regions 36 have not been introduced by ion implantation, dopant diffused from epitaxial semiconductor contact region 32 into the second semiconductor layer 2 provides the conductive doped regions 36. In one embodiment, the dopant is diffused to provide the source and drain extension regions 45, 46 and the conductive doped regions 36 by an annealing processes including, but not limited to rapid thermal annealing, furnace annealing, flash lamp annealing, laser annealing, or any suitable combination of thereof. In one embodiment, the thermal annealing is conducted at a temperature ranging from 850° C. to 1350° C.

Still referring to FIG. 10, a metal semiconductor alloy region 35 may be formed on the upper surface of the raised source and drain regions 14, 15 of the planar semiconductor device 101 and the upper surface of the epitaxial semiconductor contact region 32 of the capacitors 105. In one embodiment, the metal semiconductor alloy region 35 is composed of a silicide. Silicide formation typically requires depositing a refractory metal such as cobalt, nickel, or titanium onto the surface of a Si-containing material. Following deposition, the structure is subjected to an annealing step using conventional processes such as, but not limited to, rapid thermal annealing. During thermal annealing, the deposited metal reacts with Si forming a metal silicide. The remaining unreacted metal is removed by an etch process selective to silicides.

Following formation of the metal semiconductor alloy region 35, a dielectric material can be blanket deposited atop the entire substrate and planarized to provide an interlevel dielectric layer 60. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the interlevel dielectric layer 60 include: any of the aforementioned materials in porous form, or in a form that changes during processing to or from being porous and/or permeable to being non-porous and/or non-permeable. The interlevel dielectric layer 60 is patterned and etched to form via holes to the metal semiconductor alloy 25 on the raised source and drain region 14, 15, as well as the gate conductor 26 of the planar semiconductor device 101. Via holes are also formed to the upper semiconductor material 12 of the capacitor stack 31, and the metal semiconductor alloy 25 of the epitaxial semiconductor contact region 32, to the capacitor 105. Following via formation, interconnects 55 are formed by depositing a conductive metal into the via holes using deposition methods, such as CVD or plating. The conductive metal may include, but is not limited to tungsten, copper, aluminum, silver, gold and alloys thereof.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An integrated circuit comprising:
    a substrate having a first device region and a second device region, wherein the first device region of the substrate includes a first semiconductor layer present on a buried insulating layer, wherein the buried insulating layer is present on a second semiconductor layer, and the second device region includes the second semiconductor layer, in which the first semiconductor layer and the buried insulating layer are not present in the second device region;
    a finFET semiconductor device located in the first device region of the substrate, wherein the first semiconductor layer provides a fin body of the finFET semiconductor device and a finFET gate structure is present on a channel potion of the fin body; and
    a capacitor is in the second device region, the capacitor includes a buried plate electrode, a node dielectric and an upper electrode, wherein the buried plate electrode is present in the second semiconductor layer of the substrate and includes plateaus of material from the second semiconductor layer, wherein adjacent plateaus are separated by recessed regions of the second semiconductor layer, and an upper surface of the plateaus of second semiconductor layer that provides the buried plate electrode are vertically offset from an upper surface of the fin body, and an upper surface of the finFET gate structure is coplanar with an upper surface of the upper electrode, wherein the node dielectric is present on the buried plate electrode, and the upper electrode is present on the node dielectric.

2. The integrated circuit of claim 1, wherein the fin body has a width of less than 10 nm.

3. The integrated circuit of claim 1, wherein a dielectric cap is present on an upper surface of the fin body.

4. The integrated circuit of claim 1, wherein the finFET semiconductor device further comprises doped epitaxial source and drain regions present in direct contact with sidewalls of the fin body.

5. The integrated circuit of claim 1, wherein the buried plate electrode is a portion of the second semiconductor layer that is doped with n-type or p-type dopants.

6. The integrated circuit of claim 1, wherein the node dielectric is a conformal dielectric layer that is deposited on the plateaus of second semiconductor layer and is present on recessed portions of the second semiconductor layer between the plateaus of second semiconductor layer.

7. The integrated circuit of claim 1, wherein the upper electrode is composed of polysilicon that is doped with an n-type or p-type dopant.

8. An integrated circuit comprising:
    a substrate comprising a first device region and a second device region, the first device region of the substrate comprising a first semiconductor layer having a thickness of 10 nm or less present on a buried insulating layer that is present on a second semiconductor layer, and the second device region includes the second semiconductor layer, wherein the first semiconductor layer and the buried insulating layer is not present in the second device region;
    a planar semiconductor device in the first device region of the substrate, wherein at least the channel region of the planar semiconductor device is provided by the first semiconductor layer; and
    a capacitor including a buried plate electrode, a node dielectric, and an upper electrode present in a second device region of the substrate, in which the surface of the second semiconductor layer that is exposed is implanted to provide buried plate electrode of the capacitor.

9. The integrated circuit of claim 8, wherein the node dielectric is deposited atop the surface of the second semiconductor layer containing the buried plate electrode, and the upper electrode that is formed on the node dielectric.

10. The integrated circuit of claim 9 further comprising a capacitor stack comprising the node dielectric and the upper electrode present on a first portion of the surface of the second semiconductor layer, dielectric spacers in direct contact with sidewalls of the capacitor stack, and a contact to the buried plate electrode on a second portion of the surface of the second semiconductor layer, wherein the contact is separated from the sidewalls of the capacitor stack by the dielectric spacers.

* * * * *